United States Patent [19]

Förster et al.

[11] Patent Number: 4,822,372

[45] Date of Patent: Apr. 18, 1989

[54] PROCESSING FOR TANNING LEATHER

[75] Inventors: Frank Förster, Offenbach; Karlfried Keller, Frankfurt; Hermann Becker, Rodgau; Werner Lotz, Niedernhausen, all of Fed. Rep. of Germany

[73] Assignee: Cassella Aktiengesellschaft, Frankfurt am Main, Fed. Rep. of Germany

[21] Appl. No.: 95,136

[22] Filed: Sep. 11, 1987

[30] Foreign Application Priority Data

Sep. 25, 1986 [DE] Fed. Rep. of Germany ....... 3632587

[51] Int. Cl.⁴ ................................................ C14C 3/18
[52] U.S. Cl. .................................... 8/94.24; 8/94.19 R
[58] Field of Search .......................... 8/94.24, 94.19 R; 525/509

[56] References Cited

U.S. PATENT DOCUMENTS

| 2,316,741 | 4/1943 | Dawson | 8/94.33 |
| 2,326,740 | 4/1943 | Dawson | 8/94.32 |
| 2,944,046 | 7/1960 | Sellet | 8/94.29 |
| 3,068,190 | 12/1962 | D'Alelio | 8/94.24 |

OTHER PUBLICATIONS

Chemical Abstracts, vol. 29:10622(a) (1958).

*Primary Examiner*—Paul Lieberman
*Assistant Examiner*—John F. McNally
*Attorney, Agent, or Firm*—Connolly and Hutz

[57] ABSTRACT

An improved process for tanning leather by treating animal skins with a water-soluble melamine-formaldehyde resin in the presence of an acid catalyst towards the end is improved by using a melamine-formaldehyde resin which is at least partially etherified with a glycol ether, alkyl glycol ether, or both.

8 Claims, No Drawings

PROCESSING FOR TANNING LEATHER

Chrome tanning, which in the course of the past 60 to 80 years attained a dominant position in leathermaking, has increasingly come under ecological pressure in the last decade because of the high water pollution with chromium salts.

Since return to the vegetable or animal tanning methods employed for thousands of years before the advent of chrome tanning would have to be at the expense of drastically reduced performance levels of the leather, for example in the light fastness or heat resistance, there has been no shortage of attempts to replace the chromium salts used in tanning with other purely mineral tannins, such as titanium, zirconium or aluminium salts, or with combinations thereof with vegetable tannins.

Yet all these processes have in common that they merely replace the chromium salt by another mineral salt in the effluent and additionally, in some cases, lead to an increased pollution of the effluent with alkali metal salts.

Nor has there been any shortage of attempts in the past to replace mineral tanning with melamine-formaldehyde resin tanning. This involved drumming the resins, dissolved in water, in a very short liquor into the bated or, alternatively, lightly pickled pelt and subsequently initiating the condensation of the resins by adding an acid catalyst, preferably formic acid.

It is known from the literature (Miekeley "Das Leder" 4 (1953), page 298 et seq.; Kutsidi, Strakhov, Kozh.Obuvn.Prom 5, 16 (1963); CA 60, 10940f (1964)) that unetherified melamine-formaldehyde resins can admittedly produce adequate tanning effects on pickled skins without added chromium, but that the leathers thus tanned are highly water-absorbent and tend to become very brittle in particular in the course of storage.

Methyl- or butyl-etherified melamine-formaldehyde resins have also been proposed as tannins (Miekeley (loc. cit.); Hachihama, Kyogoku, Technol.-Repts. Osaka Univ. 6, 397 (1956); CA 52, 10622a (1958)). However, leathers tanned with butyl-etherified melamine-formaldehyde resins were too thin, while leathers tanned with methyl-etherified melamine-formaldehyde resins were pure white, had an excellent light fastness and bulkiness and a high alkali resistance and, owing to their cationic character, exhibited a high receptivity for acid and substantive dyestuffs. However, in addition to these favourable properties these leathers also had a very serious defect in respect of their tensile strength behaviour as a function of time. Immediately after tanning, these leathers tanned with melamine-formaldehyde resins had a very high tensile strength. Even after a brief period of storage, however, the tensile strength decreased markedly and fell within a period of about four weeks to 50% or less of the original value.

Tanning the skin with melamine-formaldehyde resins alone was therefore not possible despite the other excellent leather properties obtained, and the usefulness of this class of resins was restricted to the retanning of chrome leather.

Against that, it has now been found that chrome- and mineral-free full tannages can be obtained with high bulkiness and flame resistance in an environmentally acceptable tanning process without embrittling tendency on delimed and bated skins if the tanning agent used is a water-soluble melamine-formaldehyde resin which has been at least partially etherified with a glycol ether and/or alkyl glycol ether.

It has also been found that the resistance of the resin to electrolytes entrained in the skin is improved when the resin which is at least partially etherified with a glycol ether and/or alkyl glycol ether has also been anionically modified or when the resin which is at least partially etherified with a glycol ether and/or alkyl glycol ether has admixed to it an anionically modified melamine-formaldehyde resin.

For the purposes of the present invention, glycol ethers are oligomeric and polymeric condensation products of glycols, in particular of ethylene glycol. Suitable glycol ethers are thus for example diglycol, triglycol, tetraglycol, polyglycol, i.e. di-, tri-, tetra- or polyethylene glycol. Alkyl glycol ether is to be understood as meaning for the purposes of the present invention monoalkyl ethers, in particular mono-$C_1$–$C_4$-alkyl ethers, of glycols, for example of ethylene glycol, and of the aforementioned glycol ethers, i.e. of oligomeric or polymeric condensation products of glycols, in particular of ethylene glycols. Examples of suitable alkyl glycol ethers are: methylglycol (=ethylene glycol monomethyl ether), methyldiglycol (=diethylene glycol monomethyl ether), butyltriglycol (=triethylene glycol monobutyl ether). Preferred alkyl glycol ethers are alkyl ethers of the aforementioned glycol ethers, i.e. for example ethyl diethylene glycol, propyl triethylene glycol and in particular methyl diethylene glycol.

Anionic modifying agents are deemed to be alkali metal sulphites and/or alkali metal sulphamates.

In general, a melamine-formaldehyde resin which is at least partially etherified with a glycol ether and/or alkyl glycol ether and has a melamine:formaldehyde ratio of 1:(2 to 7) is used. Suitable melamine-formaldehyde resins can be prepared by condensing melamine and formaldehyde in a molar ratio of 1:(2 to 7) in the presence, per mole of melamine, of 1 to 5 moles, preferably 1 to 3 moles, of glycol ether and/or alkyl glycol ether, 0 to 1 mole, preferably 0 to 0.4 mole, of a monohydric or polyhydric alcohol and/or non-reducing sugar and/or 0 to 1 mole, preferably 0 to 0.4 mole, of alkali metal sulphite and/or alkali metal sulphamate.

The preparation of the resins modified with glycol ether and/or alkyl glycol ether is effected by one of the methods known for etherified melamine-formaldehyde resins. It has proved particularly simple and advantageous to react melamine with substantially anhydrous formaldehyde in the presence of glycol ether and/or alkyl glycol ether and, if desired, of a monohydric or polyhydric alcohol and/or of a non-reducing sugar and/or of an alkali metal sulphite or sulphamate at temperatures between 70° C. and the boiling point of the reaction mixture, preferably at 80° to 95° C., at a starting pH of 7 to 11, preferably 7.5 to 10, very particularly preferably 8.5 to 9.8, the condensation being continued for no longer than that a limited ice-water dilutability is obtained, or for no longer than that a water-diluted sample just turns cloudy at room temperature. It has to be borne in mind in this connection that, owing to the post-condensation during the cooling down, it can happen that the water dilutability also drops to values below 1:10. Yet the dilutability must not be allowed to drop to such an extent that precipitation occurs during processing. This limit is in general reached at a water dilutability of about 1:5.

The setting of the pH in the course of the condensation is preferably effected by adding a tertiary amine, for example a dialkylalkanolamine.

The substantially anhydrous formaldehyde can be for example commercially available paraformaldehyde which can for example contain up to about 10% by weight of water.

In the preparation of the resins, it is also possible to use mixtures of 2 or more glycol ethers and/or alkyl glycol ethers. In many cases a mixture of a glycol ether and an alkyl glycol ether is used.

The monohydric or polyhydric alcohol and/or nonreducing sugar which are optionally used in addition serve to improve the water solubility and the durability of the resins. Suitable additional alcohols of this type are for example: methanol, ethanol, glycol, glycerol, sorbitol, other monohydric or polyhydric alcohols individually or mixed with each other. The nonreducing sugar used is normally sucrose (=beet sugar, cane sugar). It is also possible to use a mixture of several nonreducing sugars.

The alkali metal sulphites or alkali metal sulphamates used are for example potassium sulphite or sulphamate or sodium sulphite or sulphamate in the form of individual compounds or in the form of mixtures of several alkali metal sulphites and/or alkali metal sulphamates.

Instead of using a resin which is at least partially etherified with a glycol ether and/or alkyl glycol ether and at the same time anionically modified it is also possible to use a melamine-formaldehyde resin which is at least partially etherified with a glycol ether and/or alkyl glycol ether and not anionically modified in a mixture with an anionically modified melamine-formaldehyde resin. The anionically modified melamine-formaldehyde resin can be added to the resin which is at least partially etherified with a glycol ether and/or alkyl glycol ether in an amount of up to 60% by weight, based on solid resins. This anionically modified melamine-formaldehyde resin is prepared in a manner known per se, for example by condensing melamine with aqueous formaldehyde in a molar ratio of 1:(2 to 7) in the presence, per mole of melamine, of 0 to 1 mole of one or more monohydric or polyhydric alcohols and/or non-reducing sugars and 0.1 to 1 mole of alkali metal sulphite and/or alkali metal sulphamate. Both in the preparation of the anionically modified melamine-formaldehyde resin which is at least partially etherified with a glycol ether and/or alkyl glycol ether end in the preparation of an anionically modified melamine-formaldehyde resin which is intended for mixing with a melamine-formaldehyde resin which is at least partially etherified with a glycol ether and/or alkyl glycol ether it is possible to replace up to 50% by weight, preferably up to 30% by weight, with urea.

The resulting resins, resin mixtures or mixed resins are used for tanning in a conventional manner. For example, skins of whatever animal species which have been softened, ashed and bated in a conventional manner are treated in an aqueous liquor at pH of 7 to 8.5 and at temperatures of 30° to 45° C. with 4 to 20%, based on pelt weight, of the resin solutions used according to the invention in a tanning vessel customary in tanneries for about 6 to 8 hours. The temperature of the liquor is then raised up to 50° C., and after a further period of agitation of 1 hour, 0.5 to 3%, based on pelt weight, of an acid catalyst is added to the bath. The acid catalysts used can be acids, in particular organic acids which do not damage the skin, such as, for example, formic acid, or acidic salts, such as, for example, ammonium chloride, alone or mixed with each other. Thereafter the leathers are aged and further processed like any other tanned skin material.

The process can be successfully used on any type of leather, fur or fur skin.

The leathers obtained in the process according to the invention have, depending on the way the process is carried out, shrinkage temperatures of 70° to 90° C., have a high bulkiness, are soft to firm, have, owing to their predominantly cationic character, very good dyeing properties for the dyeing with commercially available anionic dyestuffs and, owing to their white colour, even in cross-section, represent an excellent basis for the production of pure white leathers. They are tight-grained, have a very good light fastness and similar abrasion properties, tensile strength and tear propagation behaviour as chrome-tanned leather, and also good self-extinguishing properties after contact with an igniting flame, and make it possible to use any kind of after-treatment customary in leathermaking, such as retanning, fatliquoring or finishing.

The particular advantages of the process according to the invention, in addition to the very good leather properties and the possibility of producing chrome- or mineral-free leather, are the environmental acceptability and simplicity of the process. The process dispenses not only with the effluent-polluting pickling before tanning but also with the neutralization step required in the mineral tanning process. The tannery effluents are not polluted by any ecologically unsafe mineral salts whatsoever.

Examples 1 to 16 which follow relate to the preparation of the melamine-formaldehyde resins. The solids contents reported therein were determined by storing a 2 g sample of the resin in aluminium dishes at 120° C. for 1 hour and determining the weight loss. The water dilutability of the completed resin solutions was measured at 23° C., unless otherwise stated. Storage took place at room temperature. The limit of the stability of the resins is reached when the resin solution becomes cloudy and/or undergoes gelling. The pH was determined after dilution with water to an at most 50% by volume resin solution. In the examples MDEG stands for methyl diethylene glycol (=$H_3COCH_2CH_2OCH_2CH_2OH$).

The paraformaldehyde used had a water content of 10% by weight in all examples. Examples 17 to 33 concern the implementation of the process according to the invention.

EXAMPLE 1

345 g of melamine (M), 290 g of paraformaldehyde (F) having a water content of 10% by weight (molar ratio M:F=1:3.18) and 52 g of glycerol are added to a solution of 500 g of MDEG and 82 g of triethylene glycol at pH 9.1 (set with dimethylaminoethanol). After a condensation time of about 30 minutes at 90° C., all the melamine has dissolved and after a further 40 minutes or so there are signs of limited ice-water dilutability, i.e. some drops of resin solution cause clouding of an ice-water mixture.

The condensation is terminated by cooling down, and a solids content of 67% by weight is set by adding 100 ml of water. The product, which has unlimited water dilutability, possesses pH of 8.2. The highly fluent resin solution is stable for over 5 months with slight opacity appearing after about 6 weeks.

EXAMPLE 2

600 g of MDEG and 240 g of 70% strength by weight aqueous sorbitol solution are brought to pH 9.6 with dimethylaminoethanol. 348 g of paraformaldehyde (10% by weight of $H_2O$) and 414 g of melamine (M:F=1:3.18) are then added. After about 80 minutes of condensation at 90° C. the dilutability with water at room temperature is limited, and the condensation is terminated by cooling down. The solids content is brought to 70% by weight with 120 ml of water. The product which has a pH of 9.3, is dilutable with water in a ratio of 1:8.5 and stable for over 5 months.

EXAMPLE 3

350 g of melamine and 300 g of paraformaldehyde (10% by weight of $H_2O$) (M:F=1:3.24) are added to a solution of 508 g MDEG, 27 g of triethylene glycol, 52.5 g of glycerol and 70 ml of water at pH 8.9 (set with dimethylaminoethanol).

After 1 hour of condensation at 90° C. the water dilutability at room temperature is limited. The resin solution is brought to a solids content of 69% by weight with 70 ml of water. The product (pH 10.0) has a water dilutability of 1:14 and is stable for over 5 months.

EXAMPLE 4

145 g of MDEG and 19 g of n-butyldiglycol are brought to pH 8.8 with dimethylaminoethanol, and 100 g of melamine and 85 g of paraformaldehyde (10% by weight of $H_2O$) (M:F=3.21) are added. After about 90 minutes of condensation at 90° C., the dilutability with ice-water is limited. A solids content of 61% by weight is set with 30 ml of water. The product (pH 8.7) has an unlimited water dilutability. The stability is 2 weeks, with slight opacity appearing after 1 week.

EXAMPLE 5

A suspension of 100 g of melamine and 68 g of paraformaldehyde (10% by weight of $H_2O$; M:F=1:2.57) in 145 g of MDEG, 24 g of triethylene glycol and 15 g of glycerol is brought to pH 9.1 with dimethylaminoethanol and condensed at 90° C. for about 75 minutes until limited dilutability in ice-water is obtained. The product (pH 8.4) which has been brought to a solids content of 64% by weight with 30 ml of water is infinitely water-dilutable. A slight opacity appears after 5 hours and a slight cloudiness after about 2 weeks.

EXAMPLE 6

100 g of melamine and 85 g of paraformaldehyde (10% by weight of $H_2O$; M:F=1:3.21) are suspended in 200 g of MDEG, 24 g of triethylene glycol and 15 g of glycerol and brought to pH 9.1 with dimethylaminoethanol. Condensation takes place initially at 90° C. for about 40 minutes—at which time all the melamine has dissolved—and subsequently at 85° C. for about 50 minutes until limited dilutability in ice-water is obtained. The product, which has been brought to a solids content of 62% by weight with 30 ml of water, is infinitely water-dilutable and stable for over 10 weeks. The pH is 8.2.

EXAMPLE 7

100 g of melamine and 165 g of paraformaldehyde (10% by weight of $H_2O$; M:F=1:6.24) were added to a solution of 290 g of MDEG, 24 g of triethylene glycol and 15 g of glycerol which had been adjusted with dimethylaminoethanol to pH 9.0. After a condensation time of 5 hours at 90° C., a solids content of 57% by weight was set with 30 ml of water. The product (pH 7.5) is infinitely dilutable with water and stable for over 10 weeks.

EXAMPLE 8

215 g of ethyl triethylene glycol and 24 g of triethylene glycol are brought with dimethylaminoethanol to pH 8.9. Addition of 100 g of melamine, 85 g of paraformaldehyde (10% by weight of $H_2O$; M:F=1:3.21) and 15 g of glycerol is followed by condensation at 90° C. for about 40 minutes until limited dilutability in ice-water is obtained. The product is brought with 30 ml of $H_2O$ to a solids content of 71% by weight, is infinitely water-dilutable and stable for over 10 weeks, a slight opacity appearing after a few days. The pH is 8.2.

EXAMPLE 9

20 g of beet sugar are dissolved in 200 g of MDEG and 10 g of $H_2O$, and the solution is brought with dimethylaminoethanol to pH 8.9, and 138 g of melamine and 116 g of paraformaldehyde (10% by weight of $H_2O$; M:F=1:3.18) are then added. Condensation at 90° C. for 90 minutes produces limited dilutability with ice-water. The resin solution is brought with 40 ml of water to a solids content of 73% by weight. The product (pH 8.4) is infinitely water-dilutable and stable for about 3 weeks, with slight cloudiness appearing after 10 days.

EXAMPLE 10

124 g of MDEG, 24 g of triethylene glycol and 15 g of glycerol are brought to pH 9.1 with dimethylaminoethanol and 100 g of melamine and 85 g of paraformaldehyde (10% by weight of $H_2O$; M:F=1:3.21) are added. Condensation at 90° C. for 70 minutes produces limited dilutability with ice-water. The resin solution is adjusted with 30 ml of $H_2O$ to a solids content of 72% by weight and in this form, at a pH of 8.1, is infinitely dilutable with water and stable for about 4 weeks, with a slight opacity appearing after about 3 weeks.

EXAMPLE 11

A solution of 145 g of MDEG, 24 g of triethylene glycol, 15 g of glycerol and 4 g of methanol is brought with dimethylaminoethanol to pH 8.5, and 100 g of melamine and 85 g of paraformaldehyde (10% by weight of $H_2O$; M:F=1:3.21) are added. After a condensation time of about 40 minutes at 90° C. all the melamine has dissolved, and a further 20 minutes or so of condensation at 85° C. produces limited dilutability with ice-water. The resin solution is brought with 30 ml of $H_2O$ to a solids content of 67% by weight and in this form (pH 8.5) is infinitely water-dilutable and stable for about 10 weeks, with a slight opacity appearing after about 2 weeks.

EXAMPLE 12

A suspension of 100 g of melamine and 85 g of paraformaldehyde (10% by weight of $H_2O$; M:F=1:3.21) in 185 g of triethylene glycol is brought with dimethylaminoethanol to pH 9.0 and condensed for about 70 minutes at 85° C. until limited dilutability with ice-water is obtained. The clear, highly viscous resin solution is brought with 30 ml of $H_2O$ to a solids content of about 80% by weight. The product, which has a pH of 8.1, is dilutable with water in a ratio of 1:9 and is stable for over 6 weeks.

EXAMPLE 13

172 g of melamine and 145 g of paraformaldehyde (10% by weight of $H_2O$; M:F=1:3.19) are added to a solution of 250 g of MDEG, 41 g of triethylene glycol and 26 g of glycerol, and the mixture is brought to pH 9.3 with dimethylaminoethanol. The condensation is terminated by cooling down when the dilutability with ice-water is limited, and thereafter 50 ml of water and 20 ml of ethanol are added. The resin solution (pH 8.3) has a solids content of 63% by weight. It is infinitely water-dilutable and stable for over 4 weeks.

EXAMPLE 14

1,016 g of triethylene glycol are brought with dimethylaminoethanol to pH 9.6, and 523 g of paraformaldehyde (10% by weight of $H_2O$) and 550 g of melamine (M:F=1:3.6) are added. The reaction mixture is heated to 80° C., and the condensation is carried out for about 3 hours and 45 minutes until limited dilutability with ice-water is obtained. During the cooling down, a solids content of about 55% by weight is set with 1.2 l of $H_2O$. The pH of the infinitely water-dilutable resin solution is 8.7, and its stability is over 6 weeks.

EXAMPLE 15

A mixture of 210 g of triethylene glycol and 15 g of methanol is brought with dimethylaminoethanol to pH 9.5 (measured 1:1 diluted with $H_2O$). 156 g of paraformaldehyde (10% by weight of $H_2O$), 36 g of beet sugar, 66 g of 40% strength by weight aqueous sodium sulphamate solution, 10 g of urea and 126 g of melamine (M:F=1:4.73) are added in succession at 40° C. with stirring. The condensation takes place at 85° C. until a dilutability (measured at 20° C.) of 1 : 3 is obtained with saturated aqueous NaCl solution (period about 5½ hours). In the course of the cooling down, a solids content of about 55% by weight is set with 280 g of $H_2O$. The pH of the infinitely water-dilutable resin solution is 8.35, and its stability is 2 months to date.

EXAMPLE 16

A glass flask is charged with 923 g of aqueous 39% strength formaldehyde, 2 g of potassium carbonate, 165 g of beet sugar, 170 ml of deionized water, 297 g of Na sulphamate solution (40% strength), 252 g of melamine and 87 g of urea in the stated order, and the contents are heated up to 85° C. and are condensed at that temperature until the dilutability with saturated NaCl solution, measured at 20° C., is 1:2.5. The solution is then cooled down to room temperature.

EXAMPLE 17

Cattle hide is soaked, ashed, fleshed, delimed and bated, all the steps being carried out as customary in the practice of leathermaking. The pH of the pelt after bating is 7.8.

The percentages of the further process steps relate to the fleshed weight of the cattle hide. The pelt is introduced into a customary tanning vessel in 50% water at 38° C., 10% by weight of resin solution as per Example 1 is added, and agitation continues for 6 hours. A further 50% of water at 55° C. are then added, and agitation contiques at this temperature for a further hour. 1% of 85% strength formic acid and 1% of $NH_4Cl$ are then added. After a further agitation time of 30 minutes the leathers are removed from the tanning vessel, aged overnight and finished by the further process steps customary in leathermaking, such as shaving, fatliquoring, retanning, dyeing, etc.

The leathers thus obtained have a fine homogeneous and tight grain, are highly bulked, possess a smooth pleasant handle, very good colour levels and light fastness and a good tensile strength, as is revealed by the values reported in the table. The leathers also have good self-extinguishing properties after contact with an igniting flame.

EXAMPLE 18

Cattle hide is pretreated as described in Example 17. The tanning agent used is a 4% strength by weight aqueous solution of the resin as per Example 1, based on pelt weight. The further processing conditions correspond to those described in Example 17.

The leathers thus obtained have a higher tensile strength than that produced in Example 17, but a lower bulkiness.

If the cattle hide is treated in a 20% strength by weight aqueous solution (based on pelt weight), this produces leather having a higher bulkiness but a lower tensile strength than that produced in Example 17.

EXAMPLES 19 to 32

Cattle hide is treated with in each case a 10% strength by weight aqueous solution (based on pelt weight) of the resins prepared in Examples 2 to 15, under the processing conditions of Example 17. The properties of the leathers thus produced correspond to those produced in Example 17. The values of the shrinkage temperature, tensile strength, tear propagation strength and elongation at break are summarized in the table given at the end.

EXAMPLE 33

Cattle hide is treated as described in Example 17. The tanning agent used is a mixture of 5% resin solution as per Example 14 and 5% resin solution as per Example 16 (amount is based on pelt weight) in water. The leathers thus obtained are full in handle, and very elastic. The grain is fine and tight, and the leather has excellent buffability.

TABLE

| Example No. | Resin as per Example No. | Shrinkage temp. (°C.) | Tensile strength (kg/cm$^2$) | Tear propagation strength (kg/cm$^2$) | Elongation at break (%) |
|---|---|---|---|---|---|
| 17 | 1 | 87 | 286 | 42 | 58 |
| 19 | 2 | 82 | 210 | 31 | 48 |
| 20 | 3 | 82 | 227 | 29 | 52 |
| 21 | 4 | 80 | 193 | 25 | 48 |
| 22 | 5 | 83 | 155 | 27 | 42 |
| 23 | 6 | 82 | 153 | 31 | 41 |
| 24 | 7 | 85 | 272 | 36 | 68 |
| 25 | 8 | 81 | 144 | 22 | 32 |
| 26 | 9 | 84 | 157 | 24 | 44 |

TABLE-continued

| Example No. | Resin as per Example No. | Shrinkage temp. (°C.) | Tensile strength (kg/cm$^2$) | Tear propagation strength (kg/cm$^2$) | Elongation at break (%) |
|---|---|---|---|---|---|
| 27 | 10 | 80 | 167 | 47 | 52 |
| 28 | 11 | 84 | 157 | 34 | 50 |
| 29 | 12 | 82 | 252 | 26 | 83 |
| 30 | 13 | 85 | 260 | 31 | 88 |
| 31 | 14 | 77 | 447 | 81 | 100 |
| 32 | 15 | 83 | 256 | 44 | 100 |
| 33 | 14 + 16 | 84 | 182 | 37 | 80 |

What is claimed is:

1. In an improved process for tanning leather by treating animal skins with a water-soluble melamine-formaldehyde resin in the presence of an acid catalyst, the improvement comprises said melamine-formaldehyde resin having a molar ratio of melamine: formaldehyde of 1:2 to 1:7 and being at least partially etherified with a glycol ether, $C_1$-$C_4$ alkyl glycol ether or a mixture of both.

2. Process according to claim 1, wherein the melamine-formaldehyde resin is prepared by condensing melamine and formaldehyde in a molar ratio of 1:(2 to 7) in the presence, per mole of melamine, of 1 to 5 moles of a glycol ether or $C_1$-$C_4$ alkyl glycol ether, 0 to 1 mole of a monohydric or polyhydric alcohol or non-reducing sugar and 0 to 1 mole of alkali metal sulphite or alkali metal sulphamate.

3. Process according to claim 1, wherein the melamine-formaldehyde resin is prepared by condensing melamine and formaldehyde in a molar ratio of 1:(2 to 7) in the presence of 1 to 3 moles of glycol ether or $C_1$-$C_4$ alkyl glycol ether, 0 to 0.4 mole of a monohydric or polyhydric alcohol or non-reducing sugar and 0 to 0.4 mole of alkali metal sulphite or alkali metal sulphamate.

4. Process according to claim 1 wherein the melamine-formaldehyde resin is at least partially etherified with glycol ether or $C_1$-$C_4$ alkyl glycol ether and has added up to 60% by weight of an anionically modified melamine-formaldehyde resin.

5. Process according to claim 4, wherein the anionically modified melamine-formaldehyde resin added is prepared by replacing up to 50% by weight of the melamine with urea.

6. Process according to claim 4, wherein the anionically modified melamine-formaldehyde resin added is prepared by replacing up to 30% by weight of the melamine with urea.

7. Process according to claim 1, wherein the anionically modified melamine-formaldehyde resin is at least partially etherified with a glycol ether or $C_1$-$C_4$ alkyl glycol ether and is prepared by replacing up to 50% by weight of the melamine with urea.

8. Process according to claim 1, wherein the anionically modified melamine-formaldehyde resin is at least partially etherified with a glycol ehter or $C_1$-$C_4$ alkyl glycol ether and is prepared by replacing up to 30% by weight of the melamine with urea.

* * * * *